United States Patent [19]

Davidson et al.

[11] Patent Number: 5,253,702

[45] Date of Patent: Oct. 19, 1993

[54] INTEGRAL HEAT PIPE, HEAT EXCHANGER, AND CLAMPING PLATE

[75] Inventors: Howard L. Davidson, San Carlos; Ehsan Ettehadieh, Albany, both of Calif.

[73] Assignee: Sun Microsystems, Inc., Mountain View, Calif.

[21] Appl. No.: 820,566

[22] Filed: Jan. 14, 1992

[51] Int. Cl.⁵ .................... F28D 15/02; H01L 23/427
[52] U.S. Cl. .............. 165/80.4; 165/104.14; 165/104.26; 165/104.33; 29/890.032; 361/700
[58] Field of Search ............. 165/185, 104.21, 80.3, 165/80.4, 104.14, 104.26, 104.33; 361/385; 29/890.032

[56] References Cited

U.S. PATENT DOCUMENTS 3,368,359  2/1968  English et al. .............. 165/104.21
3,528,276  9/1970  Schmidt et al. ............. 165/104.21

Primary Examiner—Albert W. Davis, Jr.
Attorney, Agent, or Firm—Blakely, Sokoloff, Taylor & Zafman

[57] ABSTRACT

An integral heat pipe, heat exchanger, and clamping plate. A base plate functioning as an evaporator has disposed in it a multiplicity of intersecting parallel and perpendicular internal channels extending laterally substantially across the base plate. A sintered copper thermal wick is applied to all channels. Thin-walled condenser tubes forming a condenser region are joined to the base plate at intersections of width wise and cross wise channels contained in the base plate. A multiplicity of fins extend to all condenser tubes. For heat pipe arrangements operating in horizontal configurations, all wick-lined channels within the base plate remain open. For heat pipe arrangements intended to operate in oblique or vertical configurations, horizontally extending channels vertically displaced relative to other horizontal channels are isolated from the latter by a multiplicity of plugs. The vertically isolated horizontally extending channels constrain the working fluid and its vapor to remain within a single horizontal channel and yet disperse laterally within the maximum internal dimensions of the evaporator. Condensed working fluid returning from the condenser region to the base plate and subsequently to the heated region via capillary action is cycled more rapidly through the evaporation and condensation phases, thereby increasing the efficiency of the integral heat pipe arrangement.

17 Claims, 4 Drawing Sheets

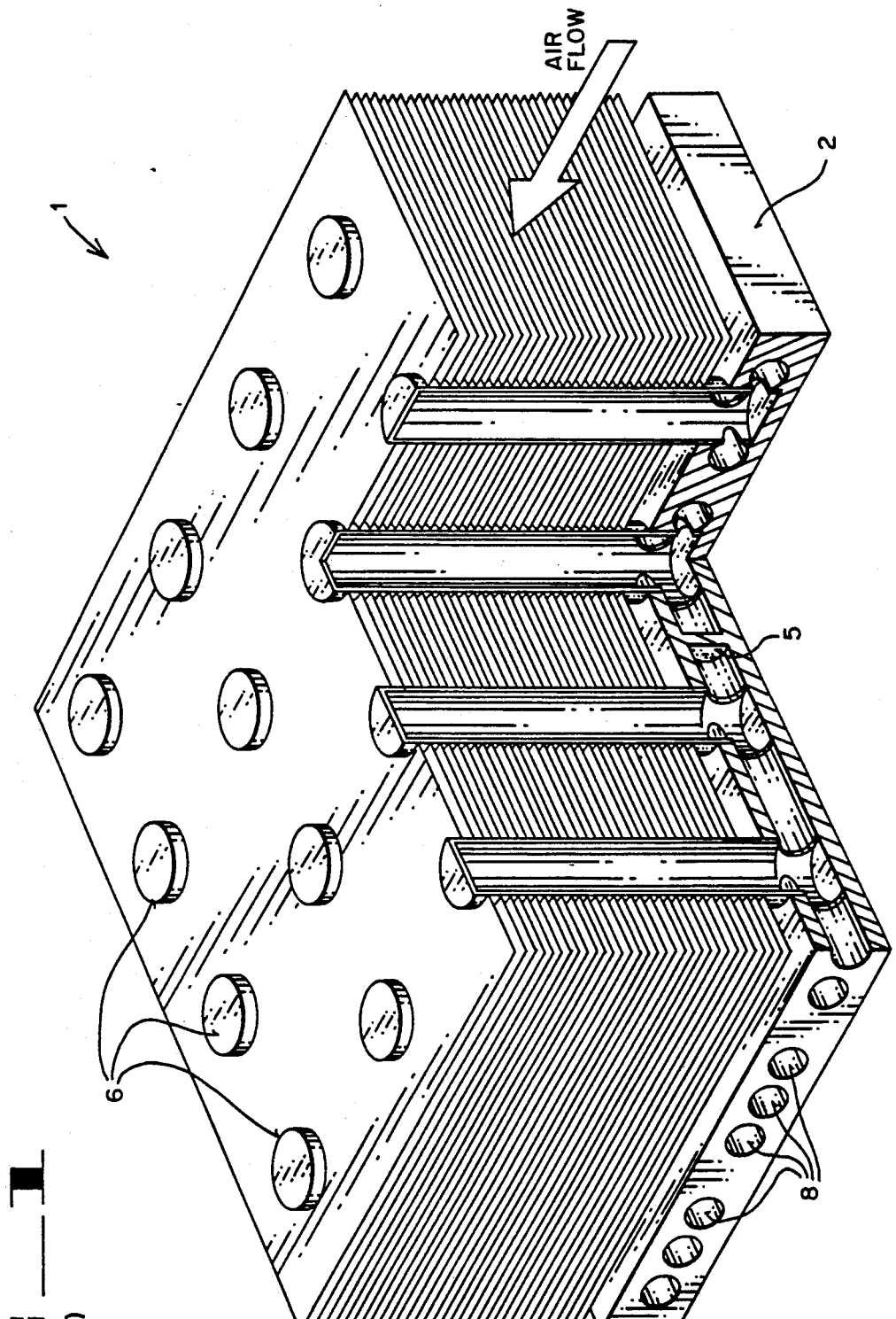
FIG—1 (PRIOR ART)

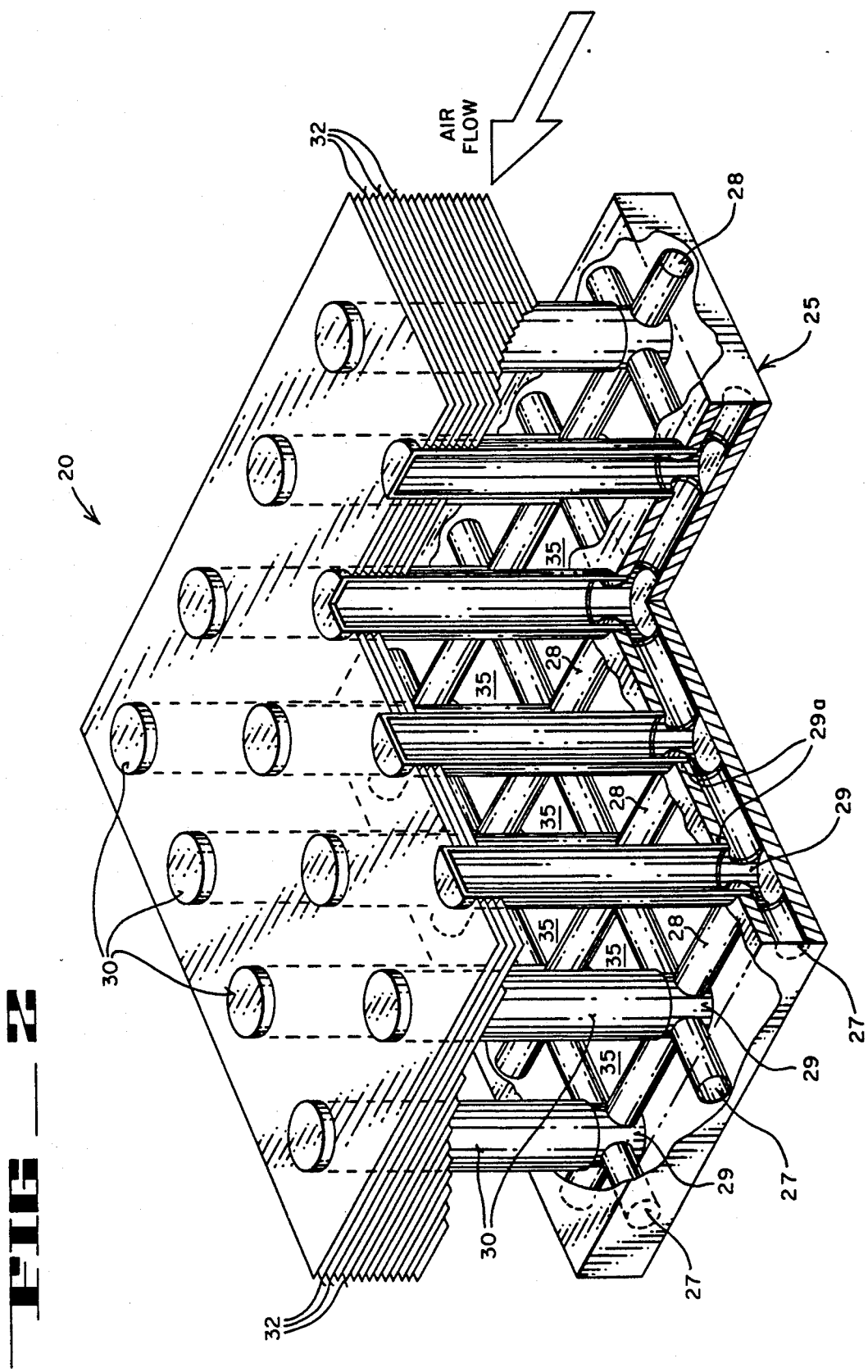

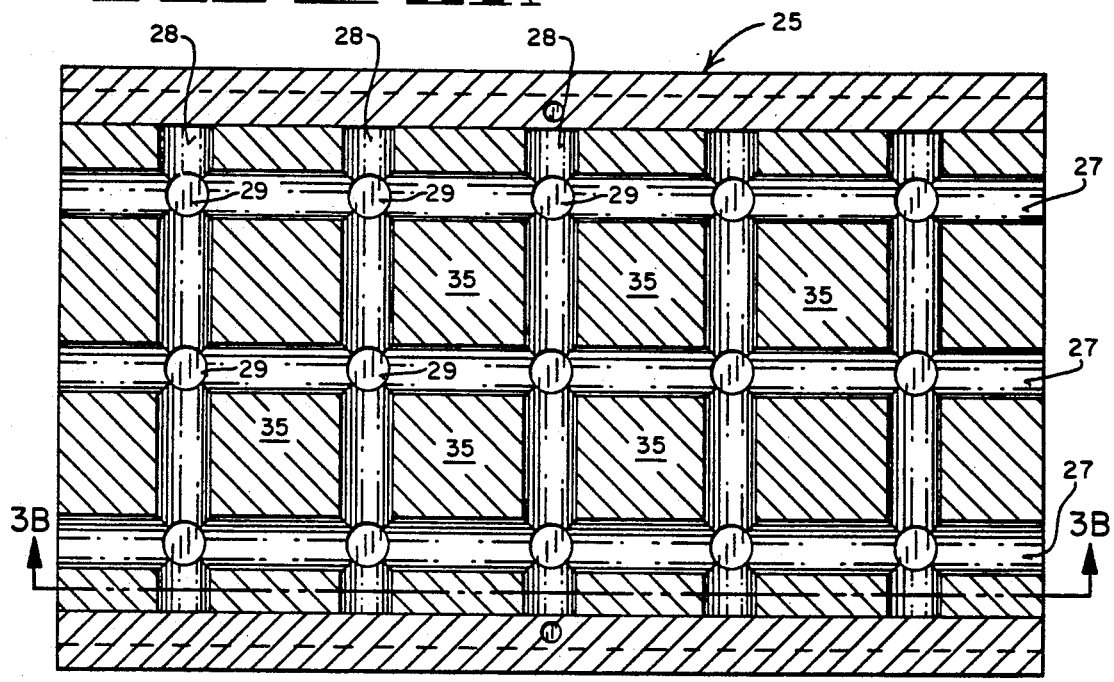
FIG_3A
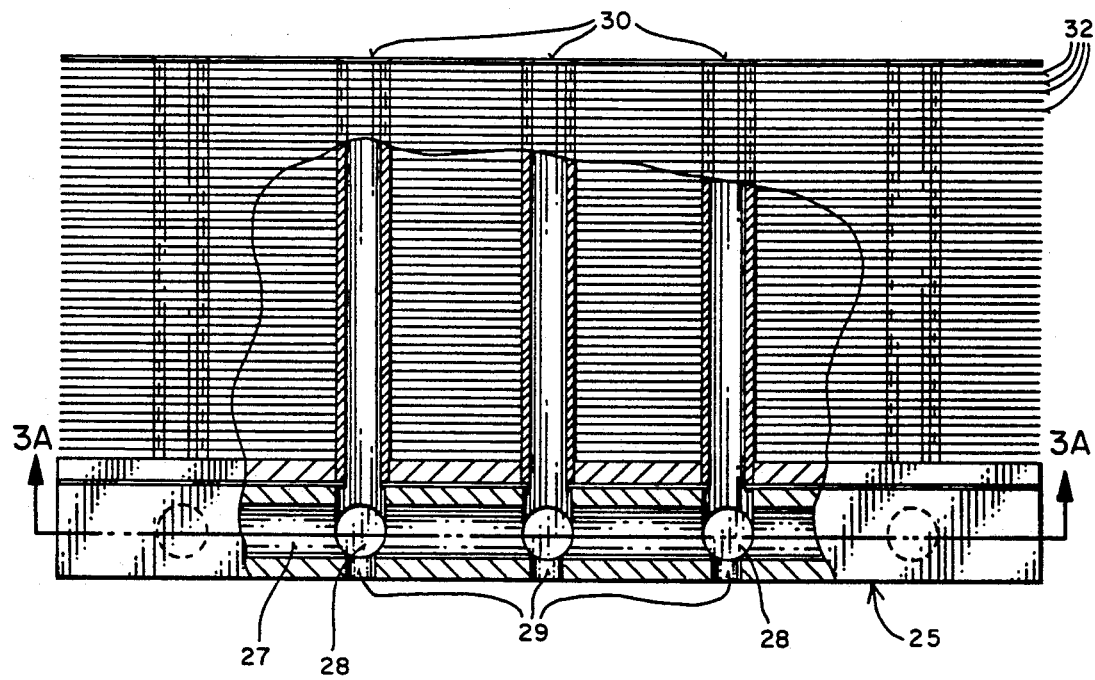
FIG_3B

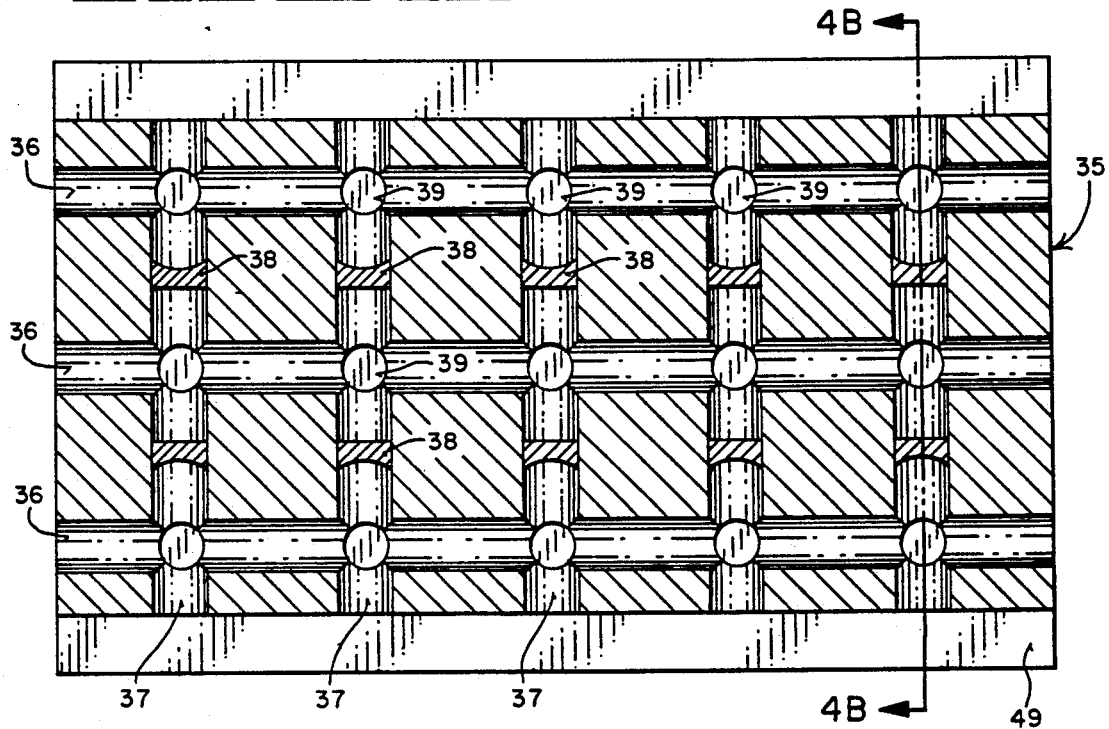
FIG _ 4A
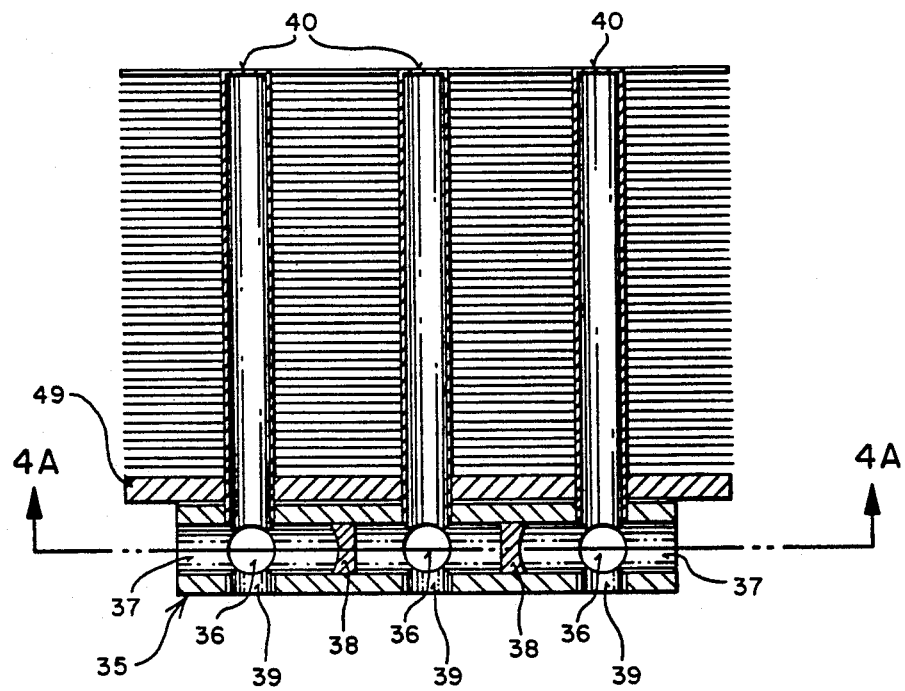
FIG _ 4B

INTEGRAL HEAT PIPE, HEAT EXCHANGER, AND CLAMPING PLATE

BACKGROUND OF THE INVENTION

1. Field of the Invention

The present invention relates to heat transfer devices, and more particularly heat transfer devices for use with electronic instrumentation and computation systems.

2. Art Background

Heat producing devices including electronic circuit elements commonly require heat dissipation facility to draw away heat sourced by the heat producing components during operation of the system. Frequently, heatsinks having an array of fins or other surface area extending geometry are firmly connected to the heat producing bodies, the thermal mass of the heatsink drawing away heat from the device and the fins transferring the heat to ambient or convective air. More recently, heat pipe technology has become more prevalent in application to commercial or industrial heat transfer applications, particularly where efficient heat transfer must be accommodated in a compact or limited physical space, or where liquid cooling techniques are impractical. Heat pipes, although known for at least twenty years and having their roots in work done in the 1940's, are just recently finding application to general commercial and industrial environments. A heat pipe is essentially a hollow thin-walled thermally conductive material, for example copper, which is evacuated and a small amount of an inert working fluid introduced into the thin-walled element, whereafter the element is hermetically sealed. Once surface of the heat pipe element draws heat away from a heat producing body in contact with the heat pipe element, and transfers it to the sealed working fluid. The working fluid is caused to locally boil, the resultant vapor moving rapidly away from the heated region through passages in the heat pipe to cooler regions where the vaporized working fluid is condensed. Capillary action in a thermal wick applied to interior surfaces of the heat pipe returns the condensed working fluid to the heated region. A fundamental feature of heat pipes is that the entire external surface of a heat pipe contacting a heat producing body may be maintained to within 1° C. for reasonable power densities. The isothermal characteristic of heat pipes is of particular interest to solid state instrumentation or computation electronics, where device junction temperatures must be maintained with in relatively narrow temperature ranges, and wherein temperature differences between chips on one circuit module must not vary significantly.

Although heat pipes have been previously used to cool computer and electronic systems components, the applicability of heat pipes to particular operating environments has been limited due to physical constraints of the heat pipe itself. For example, because a heat pipe element is typically fabricated of a thin-walled metallic material, there exists little if any structural strength in the heat pipe element itself. Accordingly, heat pipes are commonly attached to a solid base plate which is in turn clamped or otherwise brought into intimate contact with the object to be cooled. The base plate in addition to providing structural integrity for the heat pipe arrangement also provides heatsinking capability for drawing the heat away from the heated body and into the heat pipes. Representative examples of heat pipes for electronic and semiconductor cooling applications include those produced by Thermacore Incorporated, 780 Eden Road, Lancaster, PA 17601.

More recently it has been suggested by North and Avedisian in Cornell University technical report E-91-06 entitled "A Heat Pipe for Cooling High Flux Multichip Modules", published Apr., 1991, that a base plate configured as a manifold having multiple flowpaths between heat pipe elements connected to the base plate may offer improved performance over previous base plate designs. The heat pipe of North and Avedisian is illustrated in FIG. 1. With reference to FIG. 1, North and Avedisian report that a base plate 2 containing parallel sets of three wick-lined holes 8 connecting condenser elements 6 was able to dissipate high heat fluxes (greater than 20 W/cm$^2$) and high total power (greater than 800 W) while maintaining moderate surface temperatures (less than 100° C.), where the heat pipe was operating in an environment having a temperature difference between heat pipe surface and cooling air of approximately 30° C. Significantly, as North and Avedisian report in the above-cited technical paper, the heat pipe and base plate combination are able to achieve high heat fluxes and power dissipation due to large physical size, thereby rendering the heat pipe arrangement generally unsuitable for compact instrumentation or computation electronics.

Although the heat pipe assembly as developed and reported by North and Avedisian improves upon prior heat pipe designs, the reported design continues to suffer from two limitations frequently encountered in the prior art. The first limitation is that high heat fluxes and total power dissipation are generally obtained by having large base plate surface areas through which heat is transmitted via conduction to heat pipe elements mounted on an opposing surface. Alternatively, heat is conducted through a thin wall and into a working fluid residing directly in the base plate and then evaporated and later condensed on the aforesaid condenser elements. The channel design of North and Avedisian improves upon the prior art by essentially configuring the base plate as the evaporator region by providing channels in the base plate so that the working fluid may be locally evaporated and later condensed in the heat pipe condensing region. However, the design is self-limiting by providing no facility for the working fluid to transfer between adjacent condenser bundles formed by the multiple heat pipe elements. Moreover, the design of North and Avedisian does not permit the heat pipe arrangement to be operated in any orientation except with the base plate horizontal. This result stems from the condensate flow being returned via gravity to the evaporator region and hence to the wick-lined holes.

As will be explained in the following detailed description, the present invention significantly improves upon the heat transfer capability of the base plate by increasing the mobility of the evaporated working fluid within the base plate evaporator region. In addition, the present invention permits heat pipe assemblies to be optimized for either horizontal or vertical operation.

SUMMARY OF THE INVENTION

Methods and apparatus for improving heat pipe heat transfer efficiency and capacity are disclosed. A base plate which is to function as an evaporator has drilled or otherwise formed in it a number of parallel and perpendicular channels extending across the base plate in both width and length dimensions. All channels are wick-lined as in the prior art. Thin-walled condenser tubes forming the condenser region are attached to the base plate at respective intersections of width-wise and cross-wise channels within the base plate, the connection being made through a vertically drilled hole to the intersection point of the aforesaid channels. The condenser tubes are subsequently all interconnected by a multiplicity of thin fin surfaces as in the prior art. The entire arrangement is subsequently evacuated and a known quantity of working fluid introduced. For heat pipe arrangements intended to operate in horizontal configuration, all wick-lined channels within the base plate are permitted to remain open, thereby providing communication pathways for the working fluid and its vapor to any heat pipe condensing tube to any other heat pipe condensing and/or the evaporator. For heat pipe arrangements intended to operate in oblique or vertical configurations, horizontally extending channels which are vertically displaced relative to other horizontal channels are isolated from the preceding channels by a series of plugs which occlude the working fluid or its vapor from passing from a lower horizontal channel into a higher horizontal channel. The vertically isolated horizontal channels within the evaporator region constrain the working fluid to remain within a smaller vertical region and yet permit the working fluid to translate horizontally within the full internal dimensions of the evaporator. Accordingly, condensed working fluid returning from the condenser region to the base plate and subsequently to the heated region via capillary action in the work is cycled more rapidly through the evaporation and condensation phases during operation of the heat pipe, thereby increasing the efficiency of the heat pipe arrangement for non-horizontal applications. Overall efficiency of the heat pipe arrangement is further enhanced by extending wick-lined evaporator channels longitudinally in the direction cooling air is delivered over the fin surfaces attached to the heat pipe tubes extending from the evaporator base. Finally, the interlinked yet separated evaporator channels in the base plate provide structural integrity for the evaporator region, permitting the entire heat pipe assembly to be directly clamped or otherwise mechanically attached to a heat producing body without need for additional structural support.

In the preferred embodiment of the present invention, the base plate, or alternatively, the base plate together with clamping plates, are sufficiently stiff to maintain a specified flatness against a distributed compression load while being clamped at the edges of the base plate only.

BRIEF DESCRIPTION OF THE DRAWINGS

The present invention will be understood more fully from the detailed description given below and from the accompanying drawings of the preferred embodiment of the invention in which:

FIG. 1 is a perspective cut-away view of a prior art manifold heat pipe arrangement.

FIG. 2 illustrates a perspective view of the two-dimensional evaporator channel construction of the heat pipe assembly of the present invention.

FIG. 3A is a top plan view of the evaporator portion of the heat pipe assembly.

FIG. 3B illustrates a side-elevation view of the heat pipe assembly.

FIG. 4A is a side-elevation view of the second alternative embodiment of the present invention.

FIG. 4B is an end-elevation view of the second alternative embodiment of the present invention.

DETAILED DESCRIPTION OF THE INVENTION

Methods and apparatus for an integrated heat pipe heat exchanger and clamping plate for use with electronic instrumentation and computation electronics are disclosed. In the following detailed description of the preferred embodiment, for purposes of explanation, specific numbers, power densities, heat transfer coefficients, etc., may be set forth in order to provide a thorough understanding of the present invention. However, it will be apparent to one skilled in the art that the present invention may be practiced without these specific details. In other instances, well known devices are shown in block diagram form in order not to obscure the present invention unnecessarily.

With reference to FIG. 2, a preferred embodiment of a heat pipe assembly 20 constructed according to the present invention is illustrated. In FIG. 2, a base plate 25 has connected to it a number of condenser tubes 30 extending away from base plate 25 in a substantially perpendicular direction. Base plate 25 has a number of channels 27 extending horizontally across the width of base plate 25 and located generally at the centerpoint of the vertical thickness of base plate 25. Channels 27 have a sintered wick sprayed or otherwise applied to the interior surfaces of channels 27. Similarly, base plate 25 further has a number of channels 28 extending horizontally across the length of base plate 25 and located centrally about the vertical median point of the vertical dimension of base plate 25. As in the case of channel 27, lengthwise extending channels 28 have applied to them a sintered wick, whose function was explained in Art Background above and will be explained again below in connection with the operation of the present invention. Channels 27 and 28 are substantially perpendicular.

Condenser tubes 30 are located and attached to base plate 25 at intersection points of channels 27 and 28 as shown in FIG. 2. The interior volume of each condenser tube 30 will be in fluid communication with channels 27 and 28 through vertically extending channels 29. Channels 29 extend vertically between exterior surfaces of base plate 20 at the intersection points of channels 27 and 28, vertical channels 29 having an opening 29a into which condenser tubes 30 are inserted. Condenser tubes 30 may be brazed or otherwise suitably attached to baseplate 25, effecting a secure mechanical (i.e., leak tight) and thermal bond. A number of horizontally extending fins 32 extending between all condenser tubes 30 are attached as in the prior art. Spacing between fins 32 may be chosen in accordance with the particular heat transfer application encountered. Structural strengtheners 35 are structurally part of base plate 25 and are delineated by regions of base plate 25 not containing channels 27, 28, or 29. Thus, although structural strengtheners 35 may be thought of as an 'absence of structure', the material of base plate 25 remaining in the regions where strengtheners 35 are located results in added strength and torsional rigidity or stiffness. The dimensions of structural strengtheners 35 may be specified in accordance with the bending and torsional stiffness required for the particular application. The entire heat pipe assembly 20 is subsequently evacuated and thereafter a small amount of working fluid, for example water, introduced into the interior volume of heat pipe assembly 20 as defined by channels 27, 28, and 29 and condenser tubes 30.

In operation, it is anticipated that heat pipe assembly 20 will be clamped or other intimately attached to some heat producing body on the bottom side of base plate 25, and that a convective air stream will impinge upon the vertically extending condenser region formed by condenser tubes 30 and fins 32.

It should be appreciated that the perpendicularly intersecting channels 27 and 28 extending in both horizontal dimensions within base plate 25 result in significantly enhanced heat transfer and isothermal characteristics as compared to heat exchanger evaporators employing channels in only one dimension. As illustrated in FIG. 2, any particular vertically extending condenser tube 30 can be considered to be in fluid and thermal contact with any other vertically extending condenser tube 30 via intersecting channels 27 and 28. Whereas prior art heat pipe assemblies as illustrated in FIG. 1 above limit evaporated working fluid to be condensed on condenser surfaces connected to only one region of the evaporator plate, i.e., those connected to one set of cross-wise extending channels 8, the perpendicular intersecting channels 27 and 28 of the present invention permit working fluid to be condensed anywhere in the condenser structure, regardless of where the working fluid was evaporated or where the region of highest heat flux is located. Thus, heat pipe assembly 20 of the present invention as illustrated in FIG. 2 exploits fully interconnected condenser and evaporator regions in driving the working fluid through its condensed-evaporated condensed operation cycle. Enhanced heat transfer and thermal efficiency are thereby achieved in a compact size. As presently preferred, heat pipe assembly 20 is dimensioned approximately 3.5×5.5×3 inches, and yet dissipates 250 watts.

Moreover, as mentioned above, structural strengtheners 35 permit the entire heat pipe assembly 20 to be clamped or bolted via threaded fasteners directly to a heat producing body without need for additional structural support. In particular, it is contemplated that base plate 25 containing structural stengtheners 35 should be sufficiently robust to permit the entire heat pipe assembly 20 to function as structural clamping member in compact electronic systems. An example of a compact electronic system to which a heat pipe assembly of the present invention could be directly clamped may be found in U.S. Pat. application Ser. No. 801,677, entitled "Stacking Heatpipe for Three-Dimensional Electronic Packaging", filed Dec. 2, 1991, now U.S. Pat. No. 5,181,167. For example, a number of compression elements (i.e. threaded rods) could be fitted between base plate 25 and an opposing clamping plate on the opposite side of the heated body to be cooled. Accordingly, in addition to operating as an efficient evaporator for the heat pipe assembly 20, base plate 25 simultaneously provides the structural rigidly necessary to clamp the heat pipe assembly to a heated body. When additional strength is required in a thermally conductive base plate, base plate 25 may be fabricated of commercially available dispersion hardened copper, which achieves its greater strength through smaller grain size. Commercially available examples of dispersion hardened copper include Glidcop, manufactured by SCM Speciality Metals, Cleveland, Ohio.

Briefly referring to FIGS. 3A and 3B, top and side elevation views of heat pipe assembly 20 are shown. In FIG. 3A, perpendicularly intersecting channels 27 and 28 are clearly shown to intersect vertically extending channels 29 are located. Moreover, in FIG. 3B, it is seen that heat pipe tubes 30 are joined at vertically extending channels 29 and extend perpendicularly away from base plate 25.

Significantly, it is anticipated that the heat pipe arrangement 20 of the present invention should operate in configurations other than horizontal. In particular, oblique and/or vertical orientation of base plate 25 may be necessary depending on the geometry of the heat producing body to which the heat pipe assembly is to be attached. Referring now to FIG. 4A, a second alternative preferred embodiment is shown. In FIG. 4A, a base plate 45 is seen to be substantially similar to base plate 25 shown in FIGS. 2, 3A, and 3B intended for horizontal applications. Importantly however, base plate 45 illustrated in FIG. 4A has a multiplicity of plugs 38 disposed in vertically extending channels 37. Plugs 38 effectively "isolate" horizontally extending channels 36, in that working fluid and its associated vapor are constrained to flow only within a single horizontally extending region within base plate 37, consisting of a particular horizontal channel 36 and its associated condenser tubes 40, shown more clearly in FIG. 4B. Condenser tubes 40 are joined to base plate 45 substantially similar as in the case of base plate 25 shown in previous figures, joining base plate 45 at the intersection of horizontal channels 36 and vertical channels 37 through passages 39. Operation of the integral heat pipe heat exchanger and clamp shown in FIGS. 4A and 4B follows the conventional heat pipe functional characteristics, wherein the working fluid is driven through an evaporation, condensation, and re-evaporation cycle, with the condensed working fluid returning to the base plate under gravity feed.

In the second alternative embodiment shown in FIGS. 4A and 4B, plugs 38 prevent the working fluid from returning to the bottom of vertically extending channels 37. Instead, the condensed working fluid returns to the bottom of the respective horizontally extending channel 36 with its associated condenser tubes 40. Although the working fluid is constrained to move within a single vertical region generally defined by a particular horizontally extending channel 36, the working fluid is free to move entirely within that horizontally extending channel 36, the associated condenser tubes 40, and the passages 39 which join condenser tubes 40 to horizontal channels 36. In essence then, the working fluid is permitted to move horizontally throughout the entire internal dimensions of base plate 45, but is constrained vertically to a limited vertical region, depending on the location of plugs 38. Plugs 38 may be specified at the time of manufacture of base plate 45, and would be positioned in accordance with the requirements of a particular heat transfer application, including such factors as total power, heat flux, location of heat flux, etc. Alternatively, for horizontal applications, or oblique applications not exceeding a few degrees inclination, base plate 25 as shown in FIGS. 2, 3A, and 3B is sufficient.

In FIG. 4A and 4B, the second alternative embodiment is also shown to include a clamping plate 49 which provides additional bending stiffness for base plate 45 in configurations having significant point loading or moderate distributed loads. In particular, high density electrical connectors, e.g. area array connectors, may have up to 2000 electrical contact pins, each pin exerting a force of order 1-2 ounces against base plate 45 when the heat producing body (e.g. an MCM) is in position. Clamping plate 49 provides additional strength to withstand the total load exerted against base plate 45, and thereby prevent bowing of the base plate 45 and possible open circuits due to non-contacting pins. Alternatively, use of clamping plate 49 may obviate the need for expensive dispersion hardened copper as the material base plate 45; rather clamping plate 49 fabricated of inexpensive steel functions as the structural element.

The foregoing has described an integrated heat pipe, heat exchanger, and clamping plate for use with electronic instrumentation and compatible electronics. It is contemplated that changes and modifications may be made by one of ordinary skill in the art to the materials and arrangements of the elements of the present invention without departing from the spirit and scope of the invention.

We claim:

1. An integral heat pipe, heat exchanger, and clamping assembly comprising:
   an evaporator comprising a first and a second plurality of wick-lined channels containing a working fluid;
   said first plurality of wick-lined channels extending internally and laterally in a first dimension across said evaporator;
   said second plurality of wick-lined channels extending internally and laterally across said evaporator in a second dimension substantially perpendicular to said first dimension in a grid-like manner and being in fluid communication with said first plurality of wick-lined channels;
   condenser means coupled to said evaporator for condensing evaporated working fluid vapor; and,
   heat exchanger means connected to said condenser means for transferring that absorbed by said condenser means.

2. The assembly as set forth in claim 1, wherein said evaporator further comprises a plurality of structural strengtheners for increasing torsional rigidity and bending stiffness of said evaporator.

3. The assembly as set forth in claim 2, wherein said structural strengtheners comprise regions of said evaporator wherein said first and second pluralities of channels do not extend.

4. The assembly as set forth in claim 1, wherein said condenser means comprises a plurality of elongated thin-walled tubes extending perpendicularly from said evaporator and hermetically sealed to said evaporator.

5. The assembly as set forth in claim 1, wherein said evaporator further comprises a third plurality of wick-lined channels extending internally across said evaporator in a third dimension substantially perpendicular to said first and second dimensions and intersecting said first and second pluralities of channels where said first and second pluralities of channels intersect, said third plurality of channels placing said condenser means in fluid communication with said first and second pluralities of channels.

6. The assembly as set forth in claim 1, wherein said heat exchanger means comprises a plurality of fins laterally extending and thermally joined to said elongated thin-walled tubes.

7. The assembly as set forth in claim 1, wherein said evaporator further comprises a plurality of plugs disposed in said second plurality of wick-lined channels, said plugs isolating said working fluid within particular regions of said second plurality of wick-lined channels and preventing fluid communication between said first plurality of wick-lined channels.

8. An integral heat pipe, heat exchanger, and clamping assembly comprising:
   an evaporator comprising a first, second and third plurality of wick-lined channels containing a working fluid;
   said first plurality of wick-lined channels extending internally and laterally in a first dimension across said evaporator;
   said second plurality of wick-lined channels extending internally and laterally across said evaporator in a second dimension substantially perpendicular to said first dimension in a grid-like manner and being in fluid communication with said first plurality of wick-lined channels;
   said third plurality of wick-lined channels extending internally across said evaporator in a third dimension substantially perpendicular to said first and second dimensions and intersecting said first and second pluralities of channels intersect and being in fluid communication with said first and second plurality of channels;
   a plurality of structural strengtheners coupled to said evaporator for increasing torsional rigidity and bending stiffness of said evaporator
   a plurality of elongated thin-walled tubes extending perpendicular from said evaporator and hermetically sealed to said evaporator for condensing evaporated working fluid vapor; and,
   a plurality of fins extending to and thermally joined to said elongated thin-walled tubes for transferring heat absorbed by said plurality of thin-walled tubes.

9. The assembly as set forth in claim 8, wherein said structural strengtheners comprise regions of said plate wherein said first, second and third pluralities of channels do not extend.

10. The assembly as set forth in claim 9, wherein said evaporator further comprises a plurality of plugs disposed in said second plurality of wick-lined channels, said plugs isolating said working fluid within particular regions of said second plurality of wick-lined channels and preventing fluid communication between said first plurality of wick-lined channels.

11. A method of providing an integral heat pipe, heat exchanger, and clamping assembly, said method comprising the steps of;
   providing an evaporator comprising a first and a second plurality of wick-lined channels containing a working fluid;
   extending said first plurality of wick-lined channels internally and laterally in a first dimension across said evaporator;
   extending said second plurality of wick-lined channels internally and laterally across said evaporator in a second dimension substantially perpendicular to said first dimension in a grid-like manner and being in fluid communication with said first plurality of wick-lined channels;
   providing condenser means coupled to said evaporator for condensing evaporated working fluid vapor; and,
   providing heat exchanger means connected to said condenser means for transferring heat absorbed by said condenser means.

12. The method as set forth in claim 11, wherein providing said evaporator further comprises providing a plurality of structural strengtheners for increasing torsional rigidity and bending stiffness of said evaporator.

13. The method as set forth in claim 12, wherein providing said structural strengtheners comprises providing regions of said evaporator wherein said first and second pluralities of channels do not extend.

14. The method as set forth in claim 11, wherein providing said condenser means comprises providing a plurality of elongated thin-walled tubes extending perpendicularly from said evaporator and hermetically sealed to said evaporator.

15. The method according to claim 11, wherein providing said evaporator further comprises extending a third plurality of wick-lined channels across said evaporator in a third dimension substantially perpendicular to said first and second dimensions and intersecting said first and second pluralities of channels where said first and second pluralities of channels intersect, and placing said condenser means in fluid communication with said first and second pluralities of channels.

16. The method according to claim 11, wherein providing said heat exchanger means comprises providing a plurality of fins extending to and thermally joined to said elongated thin-walled tubes.

17. The method as set forth in claim 11, wherein providing said evaporator further comprises providing a plurality of plugs disposed in said second plurality of wick-lined channels, said plugs isolating said working fluid within particular regions of said second plurality of wick-lined channels and preventing fluid communication between said first plurality of wick lined channels.

* * * * *